United States Patent [19]

Sprück

[11] Patent Number: 4,622,453

[45] Date of Patent: Nov. 11, 1986

[54] ELECTRON BEAM GUN MOUNTING ON A WORK CHAMBER

[75] Inventor: Helmut Spruck, Gilching, Fed. Rep. of Germany

[73] Assignee: Leybold-Heraeus GmbH, Cologne, Fed. Rep. of Germany

[21] Appl. No.: 624,987

[22] Filed: Jun. 27, 1984

[30] Foreign Application Priority Data

Aug. 4, 1983 [DE] Fed. Rep. of Germany ....... 3328172

[51] Int. Cl.⁴ .............................................. B23K 15/00
[52] U.S. Cl. ......................... 219/121 ET; 219/121 ES; 313/361.1; 313/237
[58] Field of Search ................... 219/121 ET, 121 ER, 219/121 ES, 121 EB; 313/237, 238, 359.1, 361.1, 421, 438, 440, 456

[56] References Cited

U.S. PATENT DOCUMENTS

| | | | |
|---|---|---|---|
| 3,478,244 | 11/1969 | Meyer et al. .......................... | 313/237 |
| 3,652,821 | 3/1972 | Dietrich et al. ............... | 219/121 ET |
| 3,783,230 | 1/1974 | Peyrot ............................ | 219/121 ET |
| 3,887,784 | 6/1975 | Alais et al. ................. | 219/121 ET X |
| 4,084,076 | 4/1978 | Istomin et al. ................ | 219/121 ET |

*Primary Examiner*—Philip H. Leung
*Attorney, Agent, or Firm*—Felfe & Lynch

[57] ABSTRACT

An electron beam gun comprising a beam generator (4), an acceleration chamber (7) and a beam-guide chamber (10). The beam-guide chamber is formed by a jacket tube (19) and a beam-guide tube (18), which extends to the work chamber (1) and is surrounded by a focusing lens (15) and a deflecting device (17). For the purpose of readily adapting the equipment to suit various objective distances and for making cleaning and inspection easier, the jacket tube (19) takes the form of a hollow cylinder and is secured between two connecting flanges (20, 21) in a manner whereby it can be replaced. The upper connecting flange (20) carries a centering flange (28), on which the beam-guide tube is suspended, a shut-off valve (11) being optionally provided between the centering flange and the beam-guide tube. The lower connecting flange (21) surrounds a vacuum-connecting flange (34) in which is fitted the lower end of the beam-guide tube (18). Thus, when the beam generator (4) is removed, the beam-guide tube (18) can be extracted from the focusing lens (15) and from the deflector unit (17) through the acceleration chamber (7), together with the centering flange (28). The boundary between the vacuum and the atmosphere lies in the zone of the beam-guide tube (18) and of its various sealing elements.

10 Claims, 3 Drawing Figures

ELECTRON BEAM GUN MOUNTING ON A WORK CHAMBER

The invention relates to an electron beam gun for mounting on a work chamber and containing (a) a beam generator with a cathode and a beam-forming electrode, (b) an acceleration chamber in which an acceleration anode is arranged, and (c) a beam-guide chamber with a jacket tube and a beam-guide tube which extends between the acceleration anode and the work chamber and is surrounded by at least one focusing lens and a deflecting unit, the jacket tube interconnecting the acceleration chamber and the work chamber and acting as a supporting component.

DE-AS 15 14 782 discloses an electron beam gun generally of substantially the same type as that initially described. The acceleration chamber is surrounded by a housing which can be evacuated and which has a connection flange at its lower end. The tapered upper end of the jacket tube is connected to this flange in a vacuum-tight manner. The housing and the jacket tube form the seal between the vacuum and atmosphere and, like the wall of the acceleration chamber, constitute precision components which are matched exactly to the design data of the beam generator and of the other electron-optical components. The distance between the cathode and the focusing lens cannot be readily varied over wide limits, and the electron beam gun cannot therefore be easily adapted to give other performance data and to suit other electron-optical imaging conditions. A separate beam-guide tube is not present; instead, the acceleration anode additionally performs the function of a beam-guide tube over a short distance. Although, in the known arrangement, it is possible to exchange the cathode in a simple manner to suit requirements, this is not possible as regards the other components which surround the electron beam along its path of travel into the work chamber. The zone surrounding the beam generator and the acceleration chamber is evacuated through cross-sectional areas of appropriately great size outside the acceleration chamber and outside the acceleration anode, so that the entire volume of the jacket tube is under vacuum.

DP-PS 19 55 846 discloses an electron beam gun wherein the beam-guide tube acts as a supporting component as well as a seal against the atmosphere. The jacket tube has no supporting function and it also constitutes a specially manufactured item which cannot be adapted to suit other design data of the electron beam gun. Although, with this known arrangement, it is possible to withdraw the electromagnetic parts of the focusing lens and of the deflecting unit without abolishing the vacuum, for the purpose of thoroughly heating the equipment, removal of the beam-guide tube and of the other electron-optical components of the equipment calls for complete dismantling of the entire unit.

One of the most important functions of the beam-guide chamber is to fix the distance between the beam generator and the focusing lens by establishing a firm geometrical relationship between them. This requirement is basic to all known types of gun.

The distance between the beam generator and the focusing lens, known as the "objective distance" in electron optics, is determined by various factors. If use is made of electron beam systems having a relatively large aperture, the objective distance is kept small because of the permissible illumination of the focusing lens. This is a feature of, in particular, the low-voltage guns as they are called, which operate with voltages of up to approximately 60 kV. In the case of electron beam guns having an acceleration voltage of up to 150 kV, the aperture for the electron beam is smaller, and the permissible objective distance can thus be kept considerably greater. Consequently, in the case of low-voltage guns, the objective distance is usually only approximately one-quarter to one-third of the objective distance used in high-voltage guns.

A further criterion governing the choice of objective distance is the imaging ratio. This ultimately determines, in dependence upon the objective distance and the image distance for a given emission area of the cathode, the diameter of the electron beam (focal spot), that becomes effective on the workpiece, and therefore also the energy density of the beam and its penetration capacity. The image distance, i.e. the distance of the workpiece from the plane of the focusing lens, cannot however be varied in many cases, but in any event it is governed by the construction of the work chamber and of the means for accomodating the workpiece in the work chamber.

It follows from this that the optimum application range of electron beam guns which can be mounted on the work chambers constructed for series production is mainly restricted by the fact that the distance of the beam generator from the focusing lens is determined by the construction.

Density of energy and beam diameter are not variable to the extent desirable for reasons of welding technique or for metallurgical reasons. Low-voltage guns usually have too small an objective distance in the case of small to average beam currents, and high-voltage guns have an excessively great objective distance. Thus, because of the nature of their construction, electron beam guns cannot be satisfactorily adapted to suit the requirements of welding techniques.

Further defects of known types of gun construction are regarded as residing in the difficulty in servicing those chambers in which the electron beam is guided or through which it passes. A particular instance is the shut-off valve which is incorporated in the beam-guide chamber and by which the acceleration chamber can be separated from the work chamber while maintaining a vacuum, so that the said chambers can be flushed independently of each other. During the machining of workpieces, these chambers acquire relatively heavy vaporized metal deposits and must therefore be regularly cleaned to prevent malfunctioning of the electron beam gun. In particular, the above-mentioned shut-off valve, frequently also referred to as the gun valve or beam tube valve, tends to develop faults. Operation of the electron beam gun is usually brought to a stop after certain periods and it is taken apart for inspection purposes. This work is time-consuming and therefore costly.

An object of the present invention is, therefore, to effect improvements in an electron beam gun of the initially described kind so that its main dimensions (objective distance) can be readily adapted to suit changed design data and/or machining problems, while at the same time ease of inspection can be so improved that the time during which the entire installation is out of operation because of the need for inspecting the electron beam gun can be kept as short as possible.

Also in accordance with the invention, an electron beam gun for mounting on a work chamber comprises an electron beam generator and an acceleration chamber having an acceleration anode disposed therein. The electron beam gun also comprises a beam-guide chamber having jacket tube means and beam-guide tube means extending between the acceleration anode and the work chamber and surrounded by at least one focusing lens and deflecting means and including a centering flange. The jacket tube means comprises a hollow cylinder and is operative as supporting means coupling together the acceleration chamber and the work chamber. The jacket tube means comprises upper connecting flange means and lower connecting flange means, each of which is attached to and detachable from the beam-guide tube means. The upper connecting flange means comprises a carrier ring portion for the vacuum-tight disposition of the centering flange. The lower connecting flange means comprises an internal vacuum-connection flange portion. The beam-guide tube means has upper and lower ends and is suspended at its upper end by the centering flange in a detachable and vacuum-tight manner and is inserted at its lower end in the vacuum-connection flange portion in a vacuum-tight manner. When the beam generator is removed, the beam-guide tube means, including the centering flange, is extractable from the focusing lens and from the deflector means through the acceleration chamber.

Also according to the invention and in the case of the initially described electron beam gun, the above-mentioned object is achieved in that the jacket tube is formed as a hollow cylinder and is provided with an upper connecting flange and a lower connecting flange, each of which is detachable, in that the upper connecting flange comprises a carrier ring for the vacuum-tight accomodation of a centering flange, in that the lower connecting flange is provided with an internal vacuum-connection flange, in that the beam-guide tube is suspended by its upper end on the centering flange in a detachable and vacuum-tight manner, and is inserted by its lower end in the vacuum-connection flange in a vacuum-tight manner, and in that, when the beam generator is removed, the beam-guide tube together with the centering flange can be extracted from the focusing lens and from the deflecting unit through the acceleration chamber.

Because of the purely cylindrical form of the jacket tube and beam-guide tube as well as the releasable connection between the jacket tube and the two connecting flanges and the releasable connection between the beam-guide tube and the centering flange on the one hand and the vacuum-connection flange on the other, the length of the jacket tube and of the beam-guide tube can be varied over wide ranges (reasonable limits being assumed) without the need for separate changes or adaptations affecting the connecting flanges or flange-connecting means. An existing unit, consisting of a jacket tube and a beam-guide tube, can be easily replaced by an appropriate longer or shorter unit, so that the above-described objective distance can be readily adapted to suit the altered requirements. The required vacuum seal extends exclusively over the considerably smaller diameter of the beam-guide tube, whereas the jacket tube is not involved in the vacuum seal. Thus, the required sealing system can be achieved in an easier and more reliable manner. Furthermore, the voltage-carrying parts are disposed outside the vacuum and in the surrounding atmosphere where more favorable insulation conditions exist.

Since, as provided for in the invention, the beam-guide tube can be readily removed from the focusing lens and deflecting unit, which remain in position, the adjustment of these electron-optical components is maintained. On account of the completely axially symmetrical form of the removed parts, their adjustment is also maintained after they have been re-fitted. The described centering flange plays a special part in this respect, particularly as, in accordance with a further feature of the invention, it also carries the acceleration anode in a coaxial arrangement.

In particular, the beam-guide tube, which is exposed to a particularly marked extent to the metal vapors, can thus be easily cleaned or replaced by a fresh tube, since it constitutes an extremely inexpensive component.

The two above-mentioned connecting flanges can be connected to the jacket tube in a precisely centered position. The acceleration chamber with the beam regulator is flanged on to the upper end flange. The entire electron beam gun is attached to the work chamber by means of the lower connecting flange.

As mentioned above, the arrangement in accordance with the invention becomes particularly effective when a shut-off valve with a valve housing on which the beam-guide tube is suspended is arranged between said tube and the centering flange. When the beam-guide tube is dismantled by means of the centering flange, the shut-off valve connected directly to the centering flange is also removed and can be readily taken apart for inspection purposes, or it can be replaced. The beam-guide tube is connected only indirectly to the centering flange, but is suspended thereon in a reliable and geometrically precise manner.

Further considerable advantage accrues if, in accordance with a further feature of the invention, a choke, known per se, is secured to the valve housing, which choke has a cylindrical outer surface onto which the beam-guide tube is pushed, seals being provided between said surface and said tube. In this case, the beam-guide tube is secured indirectly by way of the choke and by way of the valve housing to the centering flange without the precise alignment being altered at all. The choke is also readily accessible for cleaning purposes after removal of the beam-guide tube.

In order also to facilitate removal of the shut-off valve from the equipment, it is particularly advantageous if the valve has a drive spindle which is disposed at right angles to the axis of the beam-guide tube and is connected to a rotary drive by way of a slot clutch. As indicated by its name, the slot clutch comprises a radial slot. Since the longer axis of the slot extends parallel to the axis of the beam-guide tube, the drive spindle which, at this point, is of square configuration, can be easily withdrawn upwardly from the slot clutch.

For a better understanding of the present invention, together with other and further objects thereof, reference is made to the following description, taken in connection with the accompanying drawings, and its scope will be pointed out in the appended claims.

An embodiment of the subject matter of the invention will now be described in greater detail by reference to FIGS. 1 to 3, wherein.

Figure 1:
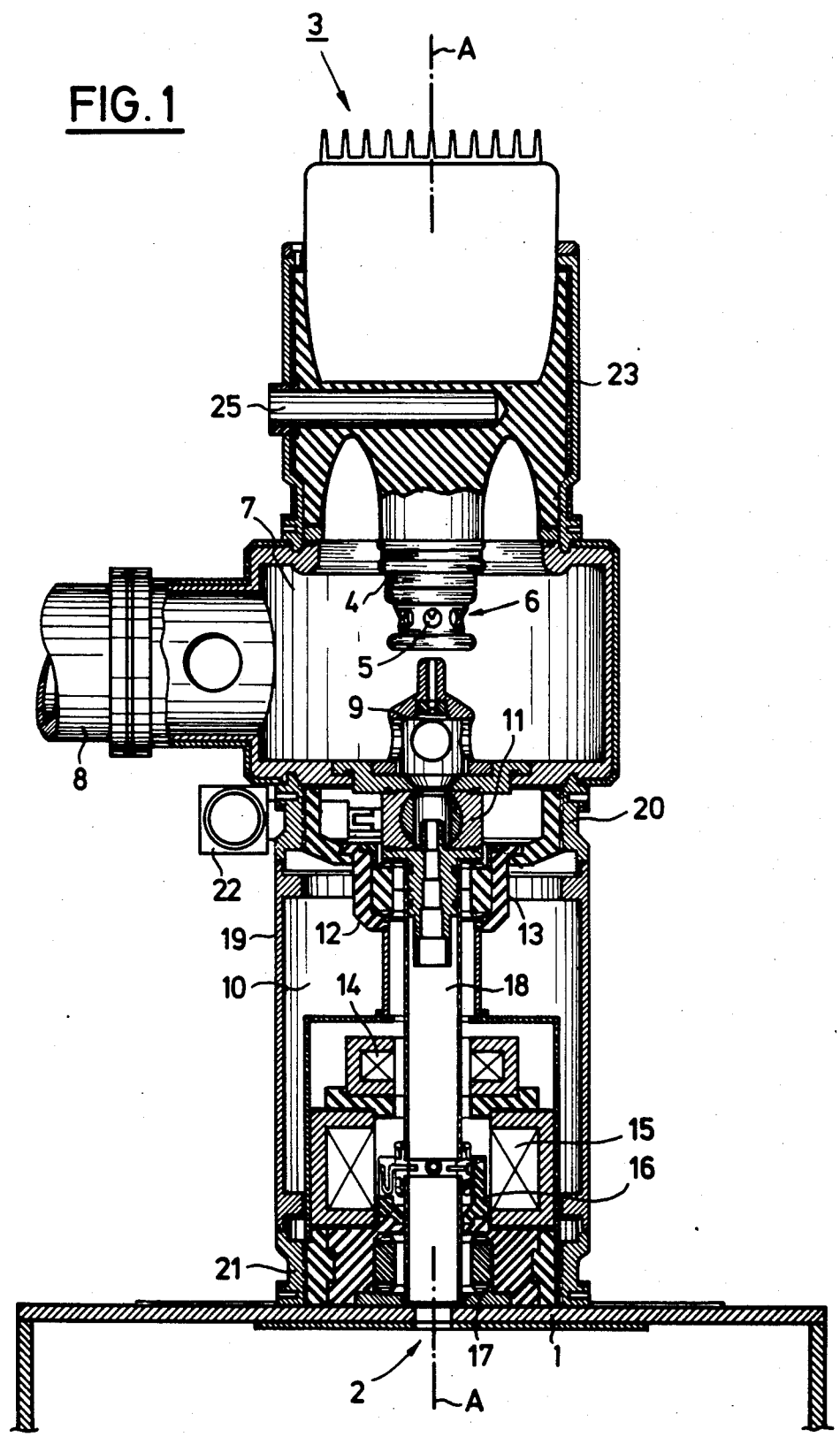
FIG. 1 is a vertical section through a complete electron beam gun.

Only the upper part of a work chamber 1 is shown in FIG. 1. Formed in the upper boundary wall is a beam-inlet opening 2, which is aligned with the axis A—A of an electron beam gun 3.

The electron beam gun 3 consists of three main parts or component groups, i.e. of a beam generator 4 with a cathode 5 and a beam-forming electrode 6 (Wehnelt cylinder), of an acceleration chamber which is connected by way of a suction port 8 to a vacuum pump, not illustrated, and of an acceleration anode 9 and a beam-guide chamber 10, in which are arranged, in the order as seen in the direction of the beam, a shut-off valve 11, a choke 12, an adjusting device 13, a wobbulator lens 14, a focusing lens 15, a sensor arrangement 16 and a deflecting unit 17. The components 13 to 17 surround a beam-guide tube 18, a radial gap, which will be described in detail below, separating said components and said tube. The beam-guide chamber 10 together with all components therein is surrounded by a jacket tube 19 which is a hollow cylinder firmly connected at its upper and lower ends to a connecting flange 20 and 21 respectively. A rotary drive 22 for the shut-off valve 11 is secured on the side of the upper connecting flange 20.

The beam generator 4 is secured to a high-voltage insulator 23.

A high-voltage terminal 25 is provided for supplying current.

Figure 2:
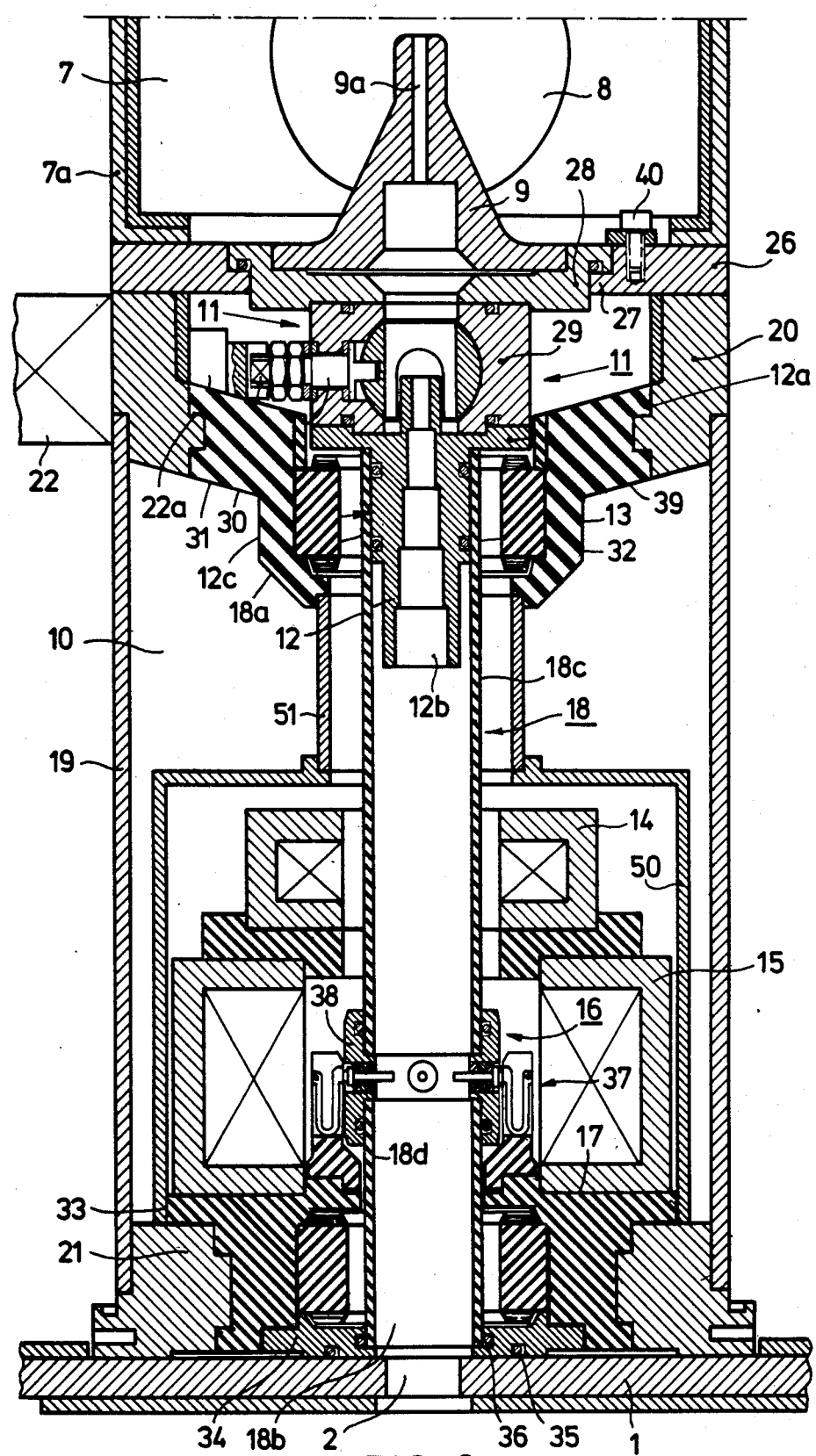
FIG. 2 represents, to a larger scale, the lower part of the FIG. 1 electron beam gun with slight modifications.

Parts shown in FIG. 2 that are similar to those seen in FIG. 1 carry the same reference numerals as in the latter Fig. The following will also be seen:

The upper connecting flange 20 is attached to a carrier ring 26, though it could also be formed integrally therewith. The carrier ring 26 has a concentric machined recess, which has an annular shoulder 27 and in which is inserted a centering flange 28. At its upper face the centering flange also has a machined recess in which is coaxially fitted the acceleration anode 9 which has a bore 9a for permitting passage of the electron beam. The shut-off valve 11 is fitted on the lower face of the centering flange 28 by means of a shallow machined centering recess, a sealing ring being provided between said flange and said valve, the spherical plug, not shown in detail, of which valve is mounted in a valve housing 29 of complementary shape. Since details of such a valve form part of the prior art, detailed description thereof is unnecessary. The plug is actuated by a drive spindle 30 which extends at right angles to the axis of the beam-guide tube 18 and is of square configuration at its free end. The rotary drive 22, coaxial with the drive spindle, has a shaft 22a, the right hand end of which contains a radial slot. The square configuration of the drive spindle 30 and the slot in the shaft 22a together form a slot clutch 31. Since the longitudinal axis of the slot extends parallel to the axis of the beam-guide tube 18, the drive spindle 30 can be removed upwardly from the slot in the shaft 22a.

On its lower face, the valve housing 29 carries the flanged rim 12a of the choke 12, a further sealing ring being fitted between said valve housing and flanged rim; the stepwise widened bore 12b of the choke also extends coaxially with the axis A—A of the system (see also FIG. 1). The choke 12 has a cylindrical outer surface 12c on which the beam-guide tube 18 is pushed at its upper end 18a, sealing elements 32 being provided between said cylindrical outer surface and said beam-guide tube.

A vacuum-connection flange 34 is fitted concentrically in the lower connecting flange 21, and an insulating member 33 consisting of lead-loaded cast resin is provided between these two flanges. The insulating member 33 is closed off from the work chamber 1 by a sealing element 35 and from the lower end 18b of the beam-guide tube 18, by a sealing element 36. The beam-guide tube is pushed into the sealing element 36.

Figure 3:
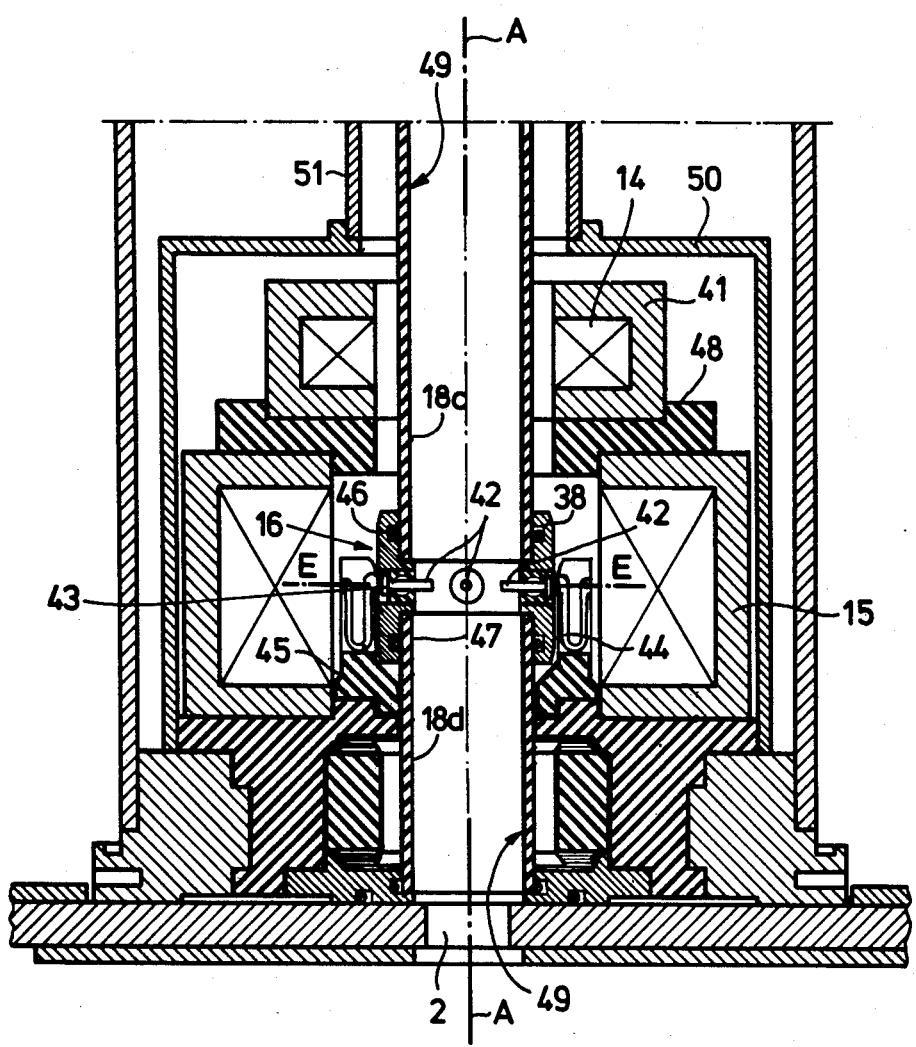
FIG. 3 represents the lower part of FIG. 2 for the purpose of explaining further details.

The beam-guide tube 18 is divided along its length at a point 37 into an upper part 18c and a lower part 18d. The ends at the point of separation are spaced from each other with sealing elements interposed and are mounted in a sensor housing 38 which forms part of the sensor arrangement 16. Reference is made to FIG. 3 regarding further details.

In the manner indicated, the beam-guide tube 18, together with its adjoining components and the interposed sealing elements, constitutes means separating the atmosphere (outside the beam-guide tube 18) and a vacuum (inside the beam-guide tube 18). It will be seen that the jacket tube 19 is not involved in providing the vacuum seal, but the acceleration chamber 7 with its housing 7a is sealed off from the carrier ring 26 in a vacuum-tight manner and consequently is under a very high operating vacuum.

By way of an insulating member 39 consisting of case resin, the upper connecting flange 20 carries the adjusting device 13 which in principle is designed as a deflecting unit similar to the deflecting unit 17. Like the insulating member 33, the insulating member 39 is filled with granulated or powdered lead so as to shut off the X-rays. The proportion of lead preferably is so selected that it has the effect of a 3–5 mm thick lead screen in the radiation direction.

The details regarding the adjusting device 13 are as follows:

In principle, additional beam adjustment is not necessary in an electron beam gun having a short beam-guide tube 18 and a short jacket tube 19, since the electron beam gun is supplied with a fixed beam voltage and the cathode has great thermal stability with regard to the shape of the chamber. However, if, for operational purposes, it is necessary to extend the objective distance and therefore the beam-guide tube 18 and the jacket tube 19, readjustment may be required. The adjusting signals are provided by means of the sensor arrangement 16 and, after appropriate (known) processing, they are passed to the adjusting device 13 which adjusts the electron beam in an X-Y plane in such manner that it lies exactly in the sensor arrangement 16. This arrangement enables the position of the focal point on the workpiece to be reproduced in an extremely simple manner despite manual adjustment. Thus, given a substantially similar form of the beam-guide chamber 10, it is possible to produce the electron beam gun with or without an adjusting device 13 and with or without a sensor arrangement 16. The electron beam gun can, however, also be suitably converted at a later stage.

The lower connecting flange 21 also carries, by way of the above-described insulating member 33, the deflecting unit 17 which is designed as a four-pole system and enables the beam in the X-Y coordinate system to be deflected in the known manner.

It will be seen that, in the stated manner, the beam-guide tube 18, with the beam generator 4 removed, can be extracted from the focusing lens 15 and from the deflecting unit 17 through the acceleration chamber 7, together with the centering flange 28. This is rendered possible because the inside diameters of the components of fixed location that surround the beam-guide tube (i.e. the wobbulator lens 14, the focusing lens 15, the deflecting unit 17, possibly the adjusting device 13) are greater than the outside diameters of the beam-guide tube 18 and of the components (sensor arrangement 16) which are mounted on the beam-guide tube and have to be passed through other components together with this tube when it is removed from the equipment. The centering flange 28 is held in the carrier ring 26 by, for example, three circumferentially spaced screws 40, and after these screws have been loosened, the centering flange with all the components attached thereto can be easily extracted upwardly from the beam-guide chamber 10.

The wobbulator lens 14 performs the known function of periodically effecting slight longitudinal displacement of the focus of the electron beam initially provided by the focusing lens 15. The axially symmetrical field produced by the wobbulator lens 14 is added to that of the focusing lens 15. The jacketing 41 of the wobbulator lens 14 is made of ferritic powder so that the entire inductivity of the wobbulator lens 14 can be kept at a level such that the change in the generated electromagnetic field is able to follow the wobbulator current up to a frequency of several kHz. It is possible to achieve wobbulation of the focus with substantially square-wave currents.

As shown in FIG. 3, the sensor arrangement 16 comprises the sensor housing 38, in which four pin-like sensors 42 are peripherally spaced in a plane E—E extending radially in relation to the axis A—A of the system, which sensors project radially at their inner ends into the bore of the beam-guide tube. By means of insulating members, not shown, the sensors are mounted in apertures formed in the sensor housing 38 and at their outer ends carry sliding contacts 43 which cooperate with complementary resilient counter-contacts 44 which are mounted in a contact cage 45 of fixed location. This arrangement renders it possible to separate the electric contacts from each other without special means when the beam-guide tube together with the sensor housing 38 is extracted. Since the sensors are therefore structural components affixed to the beam-guide tube, they are withdrawn when this tube is removed from the beam-guide chamber 10. They can then be cleaned, changed or replaced in an extremely simple manner. The vacuum-tight connection of the sensor housing 38 to the two parts 18c and 18d of the beam-guide tube is achieved with the help of the previously described sealing elements 46 and 47. The sensors 42 are, of course, also fitted in a vacuum-tight manner in the metal sensor housing 38.

The sensors 42 project symmetrically and over the same length into the beam-guide tube and are thus acted upon by the peripheral electrons of the electron beam. The received electrons are passed through the counter-contacts 44, contained in the contact cage 45, and through lines, not shown, to means for acting upon the adjusting device 13 in the manner described above. The contact cage 45 is also provided with centering adaptors which hold the sensor carrier 38 within the focusing lens 15 with the necessary precision as regards axial symmetry.

The focusing lens 15 carries an adaptor ring 48 of nonferritic material which is connected in an axially symmetrical manner to the focusing lens 15. The wobbulator lens 14 with its jacketing 41 is likewise coaxially inserted in the adaptor ring 48.

The division of the beam-guide tube into an upper part 18c and a lower part 18d clearly does not interfere with the possibility of upwardly extracting the entire beam-guide tube together with the sensor housing 38 which establishes the connection. It is also possible to change the lengths of the parts 18c and 18d individually if this should be necessary because of a change in the objective distance.

The two parts of the beam-guide tube 18 are made of plastics material in the embodiment described, the inner surface 49 being provided with an electrically conductive coating.

The described construction principle combines the following advantages:

low weight and volume and therefore a smaller high-vacuum space to be pumped out, and small surfaces;

fewer vacuum seals, all of them being of reduced total length;

replaceability of the surfaces and components subjected to vapor deposits during operation;

protection of the seals of the shut-off valve against vapor deposits;

accomodation of the lowest possible number of parts within the vacuum chamber and provision of electromagnetic lens systems and deflecting systems outside the vacuum, and the use of the greatest possible number of similar components for differing objective distances.

As shown in FIGS. 2 and 3, the electromagnetic components are also enclosed in a capsule 50 which is connected by way of a spacer sleeve 51 to the insulating member 38 of the upper connecting flange 20. Here again, adaptation to suit various objective distances can be readily achieved by differing lengths of the spacer sleeve 51. The capsule 50 is centered by means of the outer edge of the insulating member 33; the spacer sleeve 51 is centered by means of annular extensions, not shown, on the capsule 50 and on the insulating member 39 (FIG. 2). The capsule 50 and the spacer sleeve 51, like the insulating members 33 and 39, are made of a lead-loaded insulating plastics material so as to exclude X-rays.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. An electron beam gun mounting on a work chamber and comprising:
   an electron beam generator;
   an acceleration chamber having an acceleration anode disposed therein; and
   a beam-guide chamber having jacket tube means and beam-guide tube means inside said jacket tube means and extending between the acceleration anode and the work chamber and surrounded by at least one focusing lens and deflecting means and including a centering flange, the jacket tube means comprising a hollow cylinder and being effective as supporting means coupling together the acceleration chamber and the work chamber, the jacket tube means having upper and lower ends and comprising upper connecting flange means at said upper end and lower connecting flange means at said lower end, each of which is attached to and detachable from the beam-guide tube means, the upper connecting flange means comprising a carrier ring portion for the vacuum-tight disposition of the centering flange, said centering flange being disposed in said carrier ring portion and being disposed at said upper end of said jacket tube means, the lower connecting flange means comprising an internal vacuum-connection flange portion, the beam-guide tube means having upper and lower ends and being suspended at its upper end by the centering flange in a detachable and vacuum-tight manner and being inserted at its lower end in the vacuum-connection flange portion in a vacuum-tight manner, and when the beam generator is removed, the beam-guide tube means, including the centering flange, being extractable from the focusing lens and from the deflector means through the acceleration chamber.

2. An electron beam gun according to claim 1 in which the acceleration anode is mounted on the centering flange.

3. An electron beam gun according to claim 1 in which the beam-guide tube means comprises a beam-guide tube and a shut-off valve having a housing on which the beam-guide tube means is suspended.

4. An electron beam gun according to claim 3 comprising a choke having a cylindrical outer surface secured to the valve housing, the beam guide tube being pushed onto said outer surface, said beam-guide tube means comprising seals between said surface and said tube.

5. An electron beam gun according to claim 3 in which the shut-off valve comprises a drive spindle which is disposed at right angles to the axis of the beam-guide tube, said electron beam gun comprising a rotary drive having a slot clutch connected to said drive spindle.

6. An electron beam gun according to claim 1 in which the beam-guide tube means has a longitudinal direction and is divided in the longitudinal direction into an upper part and a lower part having ends disposed at a zone of separation, the electron beam gun comprising a sensor housing and four sensors for the beam position, said ends being mounted in spaced relationship and in a vacuum-type manner in the sensor housing, said four sensors being disposed in said housing in a plane at right angles to the beam-guide tube means, said sensors having sliding contacts, said electron beam gun having corresponding complementary countercontacts of fixed location.

7. An electron beam gun according to claim 6 and comprising an adjusting device for the beam position surrounding the beam-guide tube means near its upper end.

8. An electron beam gun according to claim 7 which comprises insulating members disposed individually between the upper connecting flange means and the adjusting device and between the lower connecting flange means and the deflecting means, said insulating members comprising an insulating material loaded with lead particles.

9. An electron beam gun according to claim 1 which comprises a wobbulator lens and in which the beam-guide tube is surrounded by the focusing lens, and above the focusing lens, by said wobbulator lens.

10. An electron beam gun according to claim 1 in which the beam-guide tube means has an inner surface at least a portion of which is electrically conducted.

* * * * *